US006531806B1

United States Patent
Daidai

(10) Patent No.: US 6,531,806 B1
(45) Date of Patent: Mar. 11, 2003

(54) CHIP-TYPE PIEZOELECTRIC COMPONENT

(75) Inventor: Muneyuki Daidai, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/643,143

(22) Filed: Aug. 21, 2000

(30) Foreign Application Priority Data

Aug. 23, 1999 (JP) .......................................... 11-234844

(51) Int. Cl.[7] .............................................. H01L 41/08
(52) U.S. Cl. ...................................... 310/344; 310/320
(58) Field of Search ................................ 310/320, 340, 310/344, 348, 366

(56) References Cited

U.S. PATENT DOCUMENTS

| | | | | |
|---|---|---|---|---|
| 5,235,237 A | * | 8/1993 | Leonhardt | 310/344 X |
| 5,596,243 A | * | 1/1997 | Tsuru et al. | 310/348 |
| 5,933,061 A | * | 8/1999 | Takamoro et al. | 310/366 X |
| 6,046,529 A | * | 4/2000 | Yoshida et al. | 310/348 |
| 6,160,462 A | * | 12/2000 | Sugiyama et al. | 310/348 X |

FOREIGN PATENT DOCUMENTS

| | | |
|---|---|---|
| JP | 2-219312 | 8/1990 |
| JP | 3-62917 | 3/1991 |
| JP | 3-75623 | 7/1991 |
| JP | 3-175711 | 9/1991 |
| JP | 8-167824 | 6/1996 |
| JP | 10-200368 | 7/1998 |
| JP | 11-195945 | 7/1999 |

* cited by examiner

Primary Examiner—Mark O. Budd
(74) Attorney, Agent, or Firm—Keating & Bennett, LLP

(57) ABSTRACT

A chip-type piezoelectric component has greatly increased bond strength of external electrodes while allowing the external electrodes to be easily formed. The external electrodes including a conductive paste are continuously formed on the side surface of a laminated body in which a piezoelectric element is laminated with seal substrates in addition to embedding a part of the external electrodes in recesses in which terminal electrodes of the piezoelectric element have been exposed. A metal plating layer having good solder wettability is provided on the outermost layer of the external electrode. The bonding strength between the external electrode and the laminated body is greatly improved by the wedge effect of the conductive paste penetrated in the recess, thereby preventing the electrode from peeling. The electrical continuity between the terminal electrode and the external electrode of the piezoelectric element is greatly improved because a portion of the external electrode is embedded in the recess in which the terminal electrode of the piezoelectric element is exposed.

20 Claims, 6 Drawing Sheets

CHIP-TYPE PIEZOELECTRIC COMPONENT

BACKGROUND OF THE INVENTION

1. Field of the Invention

The present invention relates to a chip-type piezoelectric component having a lamination structure including a piezoelectric element, a sealing substrate, and external electrodes on side surfaces of the laminated structure.

2. Description of the Related Art

A chip-type piezoelectric component including a laminated structure of sealing substrates and a piezoelectric element has been known in the art. For example, Japanese Unexamined Patent Application Publication No. 10-200368 discloses a chip-type piezoelectric component including a piezoelectric element on both principal surfaces on which mutually opposed vibration electrodes and terminal electrodes connected to the vibration electrodes are provided, an adhesive layer provided on the principal surface at least excluding the vibration electrode area of the piezoelectric element, and a laminated body including seal substrates bonded via the adhesive layer, wherein external electrodes for pulling the terminal electrodes out on the side surfaces at the end of the laminated body are provided. A recess in which the adhesive layer is not present is provided on the principal surface on which the terminal electrodes at the outermost sides of the piezoelectric element are provided, the external electrodes being arranged so that the side surfaces at the end of the laminated body, the side surfaces of the terminal electrodes, and the recess are electrically connected to one another.

Practical methods for forming the external electrodes that have been disclosed include a wet deposition method such as plating, a dry deposition method such as sputtering, a method for depositing a first layer by the dry deposition method such as sputtering, followed by forming a second layer by electroplating, and a method for forming the external electrodes on the side surfaces at the ends of the laminated body including conductive layers formed by the wet deposition method or by the dry deposition method, after forming the conductive layers by embedding a conductive paste in the recess.

However, since the conductive film deposited on the external electrode by wet deposition or dry deposition is relatively thin, the conductive film is attacked by a complexing agent in the plating bath rendering the film strength low, and this yields insufficient reliability in bonding between the film and the laminated body.

When the external electrodes are provided on the side surfaces at the ends of the laminated body after forming a conductive portion in the recess, on the other hand, the external electrodes are deposited in two steps, also yielding low bond strength due to poor workability in addition to the external electrodes being formed as thin films.

SUMMARY OF THE INVENTION

To overcome the above-described problems, preferred embodiments of the present invention provide a chip-type piezoelectric component including external electrodes that are easily formed while greatly increasing bond strength of the external electrodes.

Preferred embodiments of the present invention provide a chip-type piezoelectric component including a piezoelectric element on both principal surfaces of which mutually opposed vibration electrodes and terminal electrodes connected to the vibration electrodes are provided, an adhesive layer provided on the principal surface of the piezoelectric element at least excluding the vibration electrode area, and a laminated body including a seal substrate bonded via the adhesive layer, external electrodes being arranged for pulling the terminal electrodes out on the side surfaces at the ends of the laminated body, wherein the adhesive layer is not provided on the principal surface at the outermost side of the piezoelectric element, but a recess exposing the terminal electrode is provided on the side surface at the end of the laminated body, the external electrode extends continuously along the direction of thickness on the side surface at the end of the laminated body, and is defined by a monolithic conductive film embedded in the recess, and the conductive film is formed by coating and baking a conductive paste including a resin composition and metal particles.

Electrical continuity between the terminal electrodes of the piezoelectric element and the external electrodes is ensured in preferred embodiments of the present invention, because the external electrodes defined by a monolithic conductive film embedded in the recess extend continuously along the direction of thickness on the side surfaces at the end of the laminated body. In addition, the external electrodes are easily formed because they are not formed in two steps. Bonding strength between the laminated body and the external electrode is greatly improved by a wedge effect due to the conductive paste penetrated in the recess since the external electrode including the conductive paste is continuously formed on the side surface at the end of the laminated body and in the recess. Consequently, the electrode is prevented from being peeled by the attack of the complexing agent in the plating bath when the plating film is formed on the surface of the external electrode.

Preferably, a metal plating layer having a good soldering wettability is provided on the outermost layer of the external electrode. Good wettability of the solder cannot be obtained by direct soldering of the external electrode on which the conductive paste has been baked. However, a chip-type piezoelectric component with a good compatibility with soldering is obtained by providing a metal plating layer on the outermost layer of the external electrode.

Preferably, the viscosity of the conductive paste before coating is about 50 Pa·s or less, in order to allow the conductive paste to easily penetrate into the recess by capillary action, thereby preventing occurrence of insufficient filling of the conductive paste.

Preferably, the conductive paste includes at least about 80% by weight of the metal particles in order to improve conductivity as well as adhesive property to the plating layer to be provided thereon.

Preferably, the conductive paste is transferred on the side surface at the end of the laminated body by allowing the conductive paste before hardening to rise from discharge holes having slit grooves or a belt with a number of perforated holes, followed by pressing the conductive paste onto the side surface at the end of the laminated body so that the side surface crosses the discharge holes, in order to allow the conductive paste to easily penetrate into the recess without significant formation of cavities. Consequently, electrical continuity between the terminal electrode and external electrode as well as bonding of the external electrode are substantially improved.

When the conductive paste is coated on the laminated body by immersing the entire end surface of the laminated body into a dip layer of the conductive paste, as is used conventionally, air is trapped in the coating layer thereby preventing the conductive paste from penetrating to the bottom of the recess. Consequently, the conductive paste should be filled in the recess of each piezoelectric component using a dispenser. However, the coating work is difficult and insufficient in reliability because the recess has a finite size. In the case of the transfer method taking advantage of the discharge holes including a slit groove and a belt with perforation holes, on the other hand, workability is superior, and in addition, the conductive paste is securely filled in the recess because air cavities are not significantly formed by the process of pressing the conductive paste onto the surface at the end of the laminated body after allowing the conductive paste to rise from the holes.

Other features, characteristics, elements and advantages of the present invention will become apparent from the following description of preferred embodiments thereof with reference to the attached drawings.

DETAILED DESCRIPTION OF PREFERRED EMBODIMENTS

Figure 1:
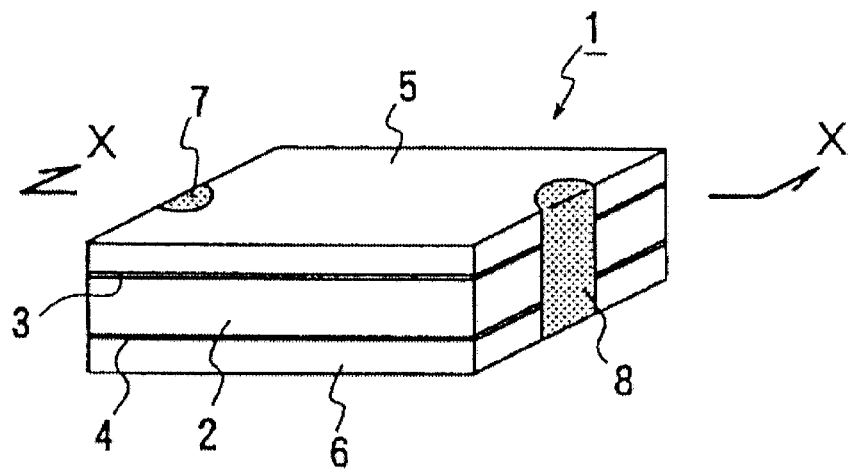
FIG. 1 shows a perspective appearance of the chip-type piezoelectric component according to a first preferred embodiment of to the present invention.

FIGS. 1 to 4 show a surface packaging type vibrator as one example of the chip-type piezoelectric component according to the first preferred embodiment of the present invention.

The vibrator 1 includes one sheet of a piezoelectric resonator element 2, and seal substrates 5 and 6 bonded on and under the resonator element via adhesive layers 3 and 4.

The resonator element 2 in this preferred embodiment corresponds to an energy trap-type vibrator with a thickness extensional vibration mode, in which a vibration electrode 2a and a terminal electrode 2b connected to the vibration electrode 2a are provided at the approximate center and at one end of the surface side principal surface, respectively, of a substrate including a piezoelectric ceramic or a piezoelectric single crystal of PZT-based ceramics. A vibration electrode 2c opposing the vibration electrode 2a, and a terminal electrode 2d elongating toward the opposite end to the terminal electrode 2b are provided on the back side principal surface of the resonator element 2, and the terminal electrode 2d is also connected to the vibration electrode 2c. These electrodes 2a to 2d are thin films formed by sputtering or vapor deposition.

While seal substrates 5 and 6 are made of a ceramic plate such as an alumina plate or a molded heat-resistant resin plate, a plate of an epoxy resin molded into a plate by injection molding is preferably included in this preferred embodiment. Recesses 5a and 6a corresponding to the sites of the vibration electrodes 2a and 2c of the resonator element 2 providing a vibration space between the resonator element 2 are provided at the approximate center of the seal substrates 5 and 6. Substantially semicircular recesses 5b and 5c (the recess 5b is not shown), and 6b and 6c are provided at both ends of the seal substrates 5 and 6. These recesses 5b and 5c, and 6b and 6c, are configured to be open to the side surfaces at both ends of the seal substrates 5 and 6.

An epoxy-based adhesive capable of putting the adhesive, for example, in a B-stage of hardening, is used for the adhesive layers 3 and 4. The hardening process of the epoxy-based adhesive is classified into three stages: the A-stage, the B-stage, and the C-stage. In the A-stage, the adhesive is not hardened yet, is insoluble in solvents, but is able to melt. In the B-stage, the adhesive is partially hardened and does not dissolve, but swells by contacting the solvent, and is in a rubbery state by heating. The stage-C refers to a final state when the adhesive turns out to be completely insoluble and to be impossible to melt after the stage-B. The adhesive layer 3 and 4 are coated on the inner surfaces of the seal substrate 5 and 6, particularly on the area excluding the recesses 5a, 5b and 5c, and 6a, 6a, 6b and 6c. Thus, the adhesive layer 3 and 4 have open parts 3a and 4a corresponding to the recesses 5a and 6a, and cut parts 3b and 3c, and 4b and 4c corresponding to the recess 5b and 5c, and 6b and 6c, respectively, of the seal substrate 5 and 6. The adhesive is prevented from seeping and protruding when the resonator element 2 is laminated with the seal substrates 5 and 6, since the adhesive layer 3 and 4 include an epoxy-based resin capable of being placed in the B-stage. As a result, vibration spaces are provided around the vibration electrodes 2a and 2c of the resonator element 2, and the recesses open to the side surfaces at the end of the laminated body A (see FIG. 4) are provided on the outermost side of the resonator element 2 by taking advantage of the recesses 5b and 5c, and 6b and 6c of the seal substrates 5 and 6. Particularly, the terminal electrodes 2b and 2d are exposed to the recesses 5b and 6c of these recesses.

Figure 2:
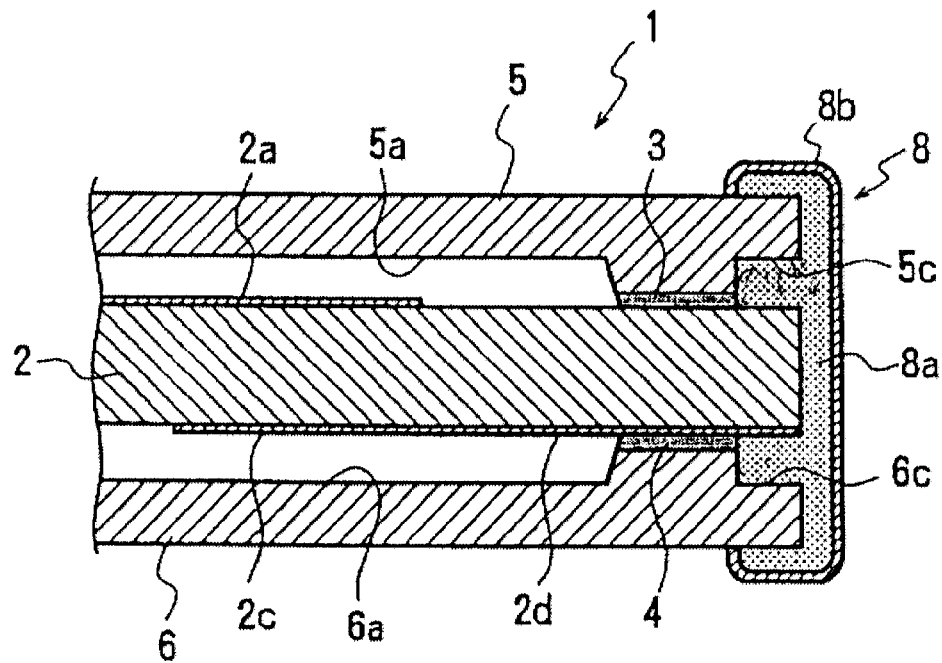
FIG. 2 shows an enlarged partial cross-section cut along the line X—X in FIG. 1.
Figure 3:
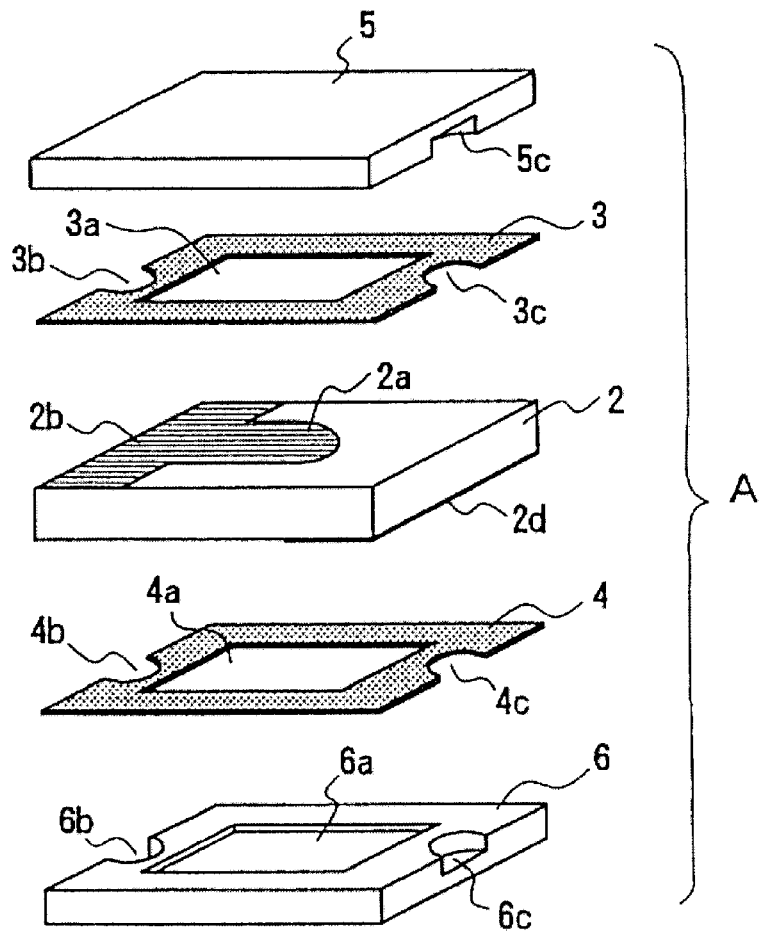
FIG. 3 shows a disassembled perspective view of the chip-type piezoelectric component shown in FIG. 1.
Figure 4:
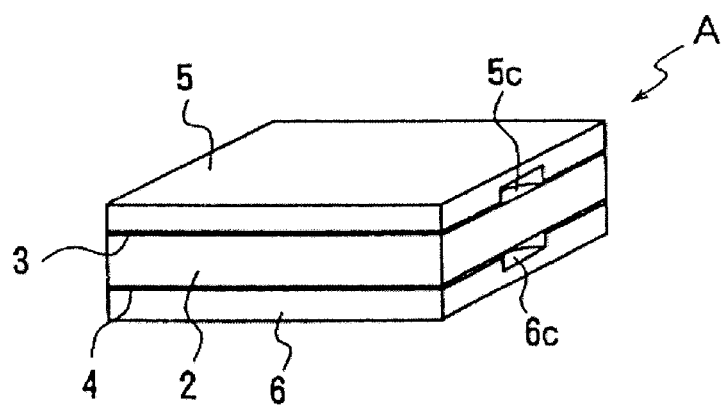
FIG. 4 shows a perspective view of the laminated body before forming the electrode of the chip-type piezoelectric component shown in FIG. 1.

After forming the laminated body A as described above, external electrodes 7 and 8 continuously elongating as a belt along the direction of thickness are provided on the side surfaces at the end of the laminated body A on which the recesses 5b and 5c, and 6b and 6c are provided. While only one external electrode 8 is shown in FIG. 2, the other external electrode 7 preferably has substantially the same structure as the external electrode 8. The substrate electrodes 7a and 8a of the external electrodes 7 and 8 are conductive films made by coating and baking a conductive paste. The electrodes are provided with a width that is sufficient to cover the recesses 5b and 5c, and 6b and 6c, and the ends of the electrodes elongate toward the surface and the back surface of laminated body A. A portion of the substrate electrodes 7a and 8a are filled in the recesses 5b and 5c, and 6b and 6c, to electrically connect the substrate electrodes 7a and 8a to the terminal electrodes 2b and 2d.

The conductive paste in this preferred embodiment preferably has the following composition: Binder (phenol resin and epoxy resin): 10% by weight Silver powder (spherical powder and flake powder): 81% by weight Solvent and additives: 9% by weight The starting materials above were mixed and the viscosity of the mixture was adjusted to about 20 Pa·s. The conductive paste was coated on the side surface at the end of the laminated body A by transfer printing, and after drying the solvent at about 100° C., the paste was hardened by heat treatment at about 180° C. for approximately 60 minutes.

A spherical powder and a flake powder were used for the metal powder in the conductive paste in the preferred embodiment because, since the contact probability among the fillers may be increased to enhance reliability of electrical continuity by adding the flake powder, the powder leaves many spaces behind, making uniform plating difficult. For compensating for the problems described above, the spherical filler is also added in order to fill the gaps as described above, thereby enabling a uniform plating film to be formed.

Figure 5A:
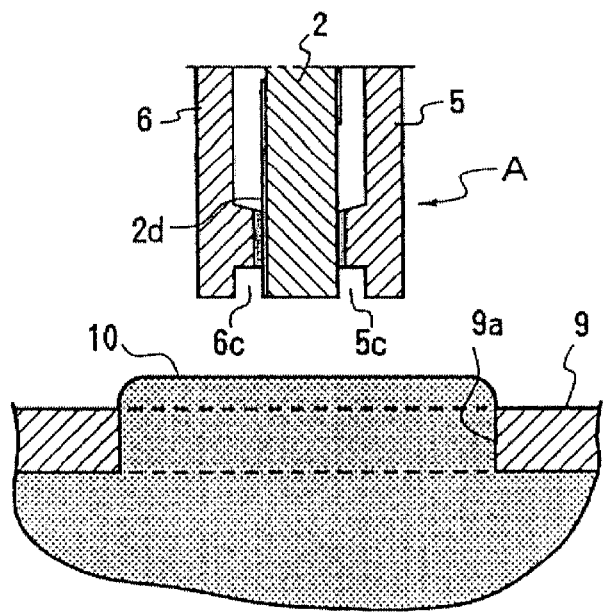
FIG. 5A shows a first manufacturing step for forming the external electrode on the chip-type piezoelectric component shown in FIG. 1.
Figure 5B:
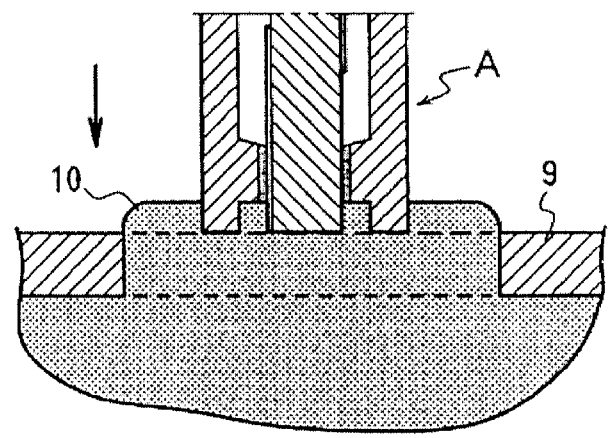
FIG. 5B shows a second manufacturing step for forming the external electrode on the chip-type piezoelectric component shown in FIG. 1.
Figure 5C:
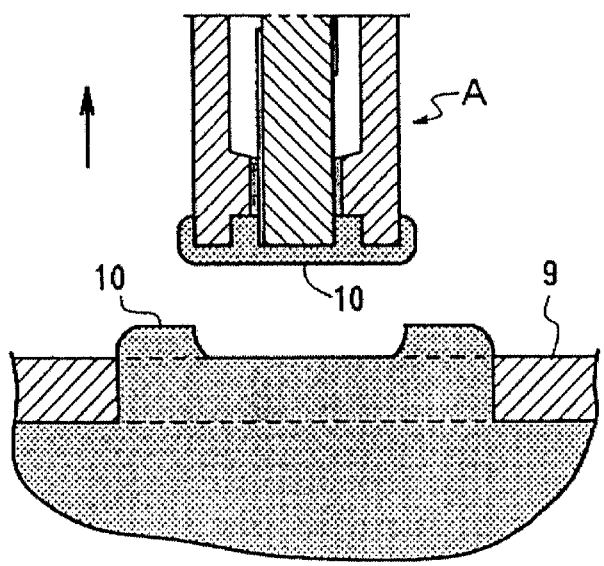
FIG. 5C shows a third manufacturing step for forming the external electrode on the chip-type piezoelectric component shown in FIG. 1.

FIGS. 5A to 5C show a method for coating the conductive paste constituting the substrate electrodes 7a and 8a.

A transfer apparatus as described, for example, in Japanese Unexamined Patent Application Publication No. 3-62917, is used in the coating method as described herein. The reference numeral 9 denotes a coating plate having a slit of perforated discharge holes 9a. A reservoir layer for storing a large quantity of the conductive paste 10 is provided below the coating plate 9. The conductive paste 10 is discharged through the discharge hole 9a, when the pressure acting on the reservoir layer is increased.

FIG. 5A shows an initial state in which the laminated body A is disposed above the coating plate 9 so that the side surface at the end of the laminated body A is substantially perpendicular to the discharge holes 9a.

FIG. 5B shows a state in which the side surface at the end of the laminated body A is pressed onto the upper surface of the coating plate 9. Since the conductive paste 10 rises from the coating plate 9, air is not significantly trapped in the recesses 5b and 5c, and 6b and 6c, allowing the conductive paste 10 to easily penetrate into the recesses. The conductive paste 10 is then filled in the recess by allowing the paste to penetrate into the narrow bottom of the recess by the surface tension of the paste itself.

FIG. 5C shows the state when the laminated body A is removed from the coating plate 9. The conductive paste 10 coated on the recesses 5b and 5c, and 6b and 6c, and on the side surface at the end of the laminated body A is prevented from being peeled from the laminated body A due to its adhesive property.

The configuration of the discharge hole 9a of the coating plate is not restricted to a slit, but it may include a plurality of parallel slit holes, or have an assembly of many perforated holes.

Metal plating layers 7b and 8b (the layer 7b is not shown) having good solder wettability are provided, as shown in FIG. 2, on the substrate electrodes 7a and 8a. A Ni plating layer is provided as an intermediate layer, and an Sn plating layer is provided as the uppermost layer in these metal plating layers 7b and 8b. Actually, Sn may be plated by electroplating after forming the Ni layer by electroplating. The Ni plating layer serves as a barrier layer for preventing corrosion of the solder, while the Sn plating layer functions to improve wettability to the solder. Gold plating may be applied for the uppermost plating layer instead of Sn plating.

Since the substrate electrodes 7a and 8a on which the conductive paste is baked are provided not only on the side surface at the end of the laminated body A, but also the conductive paste is filled in the recesses 5b and 5c, and 6b and 6c in the oscillator described in the foregoing preferred embodiment, the portions of the electrodes penetrating into the recesses serve as wedges to improve bonding strength to the laminated body A. Accordingly, the substrate electrodes 7a and 8a are securely prevented from peeling from the laminated body A in the plating step and soldering step to be applied thereafter.

While the recesses 5a and 6a for providing vibration spaces, and the recesses 5b and 5c, and 6b and 6c, have been provided on the inner surfaces of the seal substrates 5 and 6 for improving electrical continuity and for enhancing bond strength of the electrodes, flat seal substrates having no such recesses may be also used. Sheets of an adhesive having a given thickness are used for the adhesive layers 3 and 4 in this case for providing vibration spaces and recesses, wherein open portions for the vibration spaces and cut portions for the recesses may be previously provided on the sheet of the adhesive.

FIGS. 6 to 10 show a chip-type piezoelectric filter according to a second preferred embodiment of the present invention.

The chip-type piezoelectric filter according to this preferred embodiment includes two piezoelectric resonator elements 11 and 12 using the thickness extensional vibration mode, and two seal substrates 20 and 21.

A pair of vibration electrodes 13a and 13b is placed at approximately the center area in opposed relation to one another with a distance apart on the first resonator element 11. The vibration electrode 13a is connected to a terminal electrode 15a extending to one corner of the resonator element 11, and the vibration electrode 13b is connected to a capacitance electrode 15b, which also functions as a terminal electrode, extending to the diagonal corner relative to the former corner.

A common electrode 13c is provided on the lower surface of the resonator element 11 so as to be opposed to the vibration electrodes 13a and 13b. The common electrode 13c is connected to terminal electrodes 15c and 15d arranged so as to be substantially parallel to the opposed two side surfaces of the resonator element 11, to a capacitance electrode 15e that is opposed to the capacitance electrode 15b via the resonator element 11, and to a shield electrode 15f provided so as to be substantially parallel to the side line at the opposite side to the side where the capacitance electrode 15e is provided.

Figure 8:
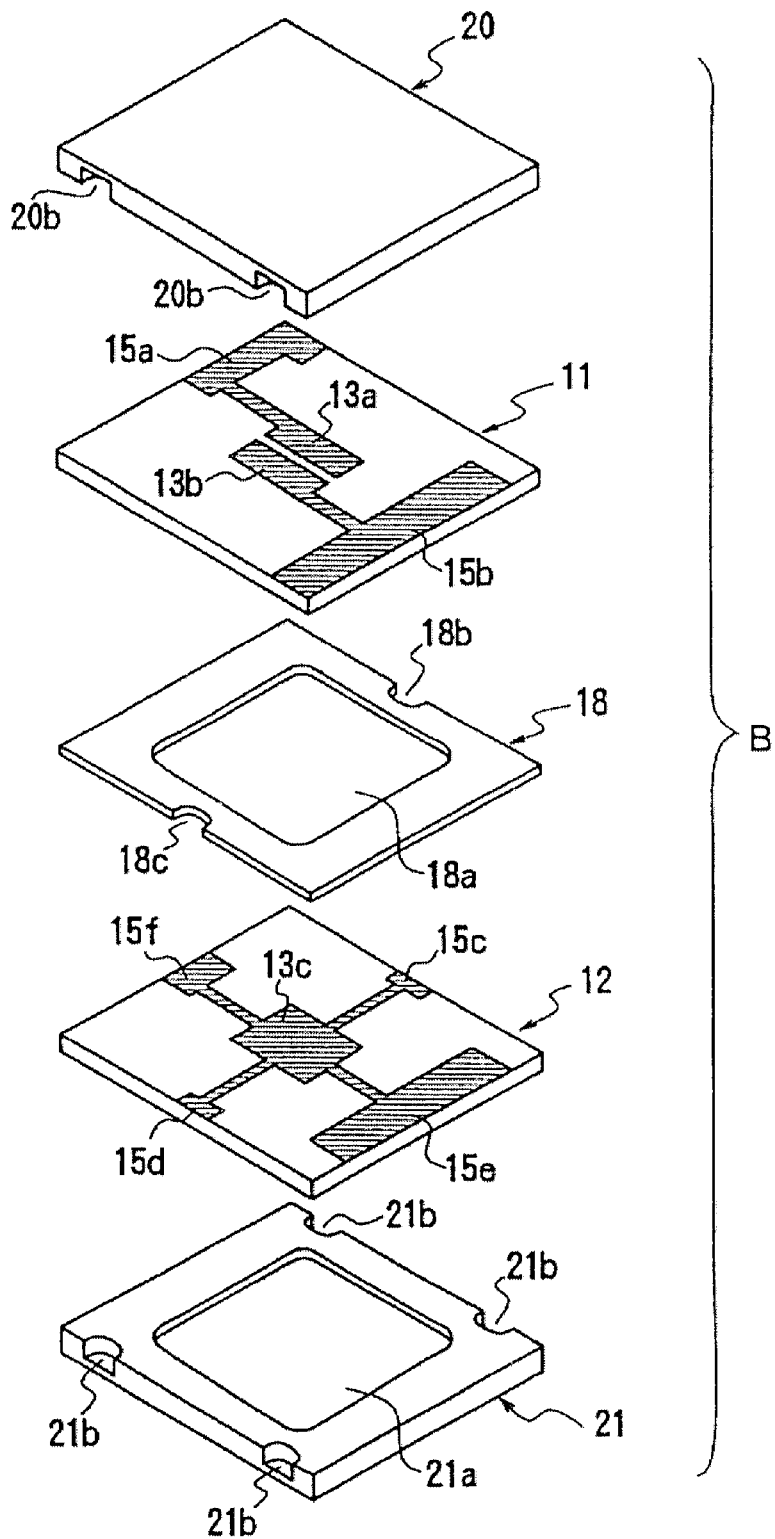
FIG. 8 shows a disassembled perspective view of the chip-type piezoelectric component shown in FIG. 6.

While only the upper surface of the first resonator element 11 and the upper surface of the second resonator element 12 are shown in FIG. 8, the electrode provided on the lower surface of the first resonator element 11 is preferably substantially identical to the electrode provided on the upper surface of the second resonator element 12, and the electrode provided on the lower surface of the second resonator element 12 is preferably substantially identical to the electrode provided on the upper surface of the first resonator element 11. Accordingly, duplicated explanations of the electrode on the lower surface of the second resonator element 12 corresponding to the electrode on the upper surface of the first resonator element 11, and of the electrode on the lower surface of the first resonator element 11 corresponding to the electrode on the upper surface of the second resonator element 12 will be omitted herein and the same reference numerals are used.

The first and second resonator elements 11 and 12 are laminated and bonded to one another along the direction of the thickness via a sheet of an intermediate layer 18 and an adhesive layer (not shown). Thus, the first and second resonator elements 11 and 12 are bonded to the sheet of the intermediate layer 18 while the common electrodes 13c and 13c of the first and second piezoelectric filters are directed toward the inside. The sheet of the intermediate layer 18 is provided so that vibration spaces are maintained between the first and second resonator elements 11 and 12, besides providing the recesses for filling the conductive paste to be described hereinafter. A sheet manufactured by punching, for example, a heat-resistant resin sheet, is used for the purpose above. The intermediate layer 18 includes an open part 18a for providing a vibration space, and cut portions 18b and 18c for providing recesses at the sites corresponding to the terminal electrodes 15c and 15b. It is also possible to omit the intermediate layer 18 by using a sheet of an adhesive layer as the adhesive layer.

A seal substrate 20 is laminated and bonded above the first resonator element 11 via an adhesive layer (not shown), and a seal substrate 21 is laminated and bonded below the second resonator element 12 via an adhesive layer (not shown). The seal substrates 20 and 21 have the same shape except the shape of the electrode, and first recesses 20a and 21a for providing the vibration spaces are provided on the inner surfaces of the seal substrates, while two second recesses 20b and 21b (a total of four recesses) are provided on respective ends of opposed two edges. The first recess 20a of the upper side seal substrate 20 is not shown in the drawing. The adhesive layers for bonding the resonator element 11 to the seal substrate 20, and the adhesive layer for bonding the resonator element 12 to the seal substrate 21 are configured to have the same shapes as those on the inner surface of the seal substrates 20 and 21. In other words, open portions are provided on the sites corresponding to the first recesses 20a and 21a, and cut portions are provided at the sites corresponding to the second recesses 20b and 21b.

Figure 6:
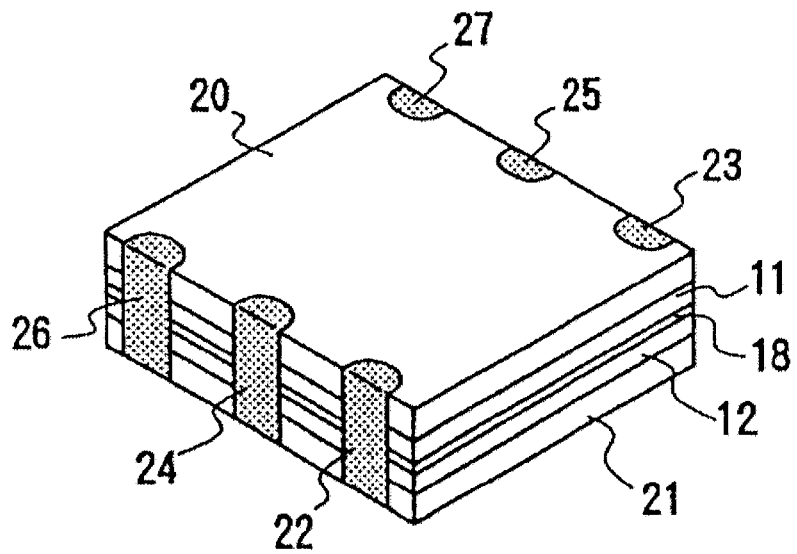
FIG. 6 shows a surface view of the perspective appearance of the chip-type piezoelectric component according to a second preferred embodiment of to the present invention.
Figure 7:
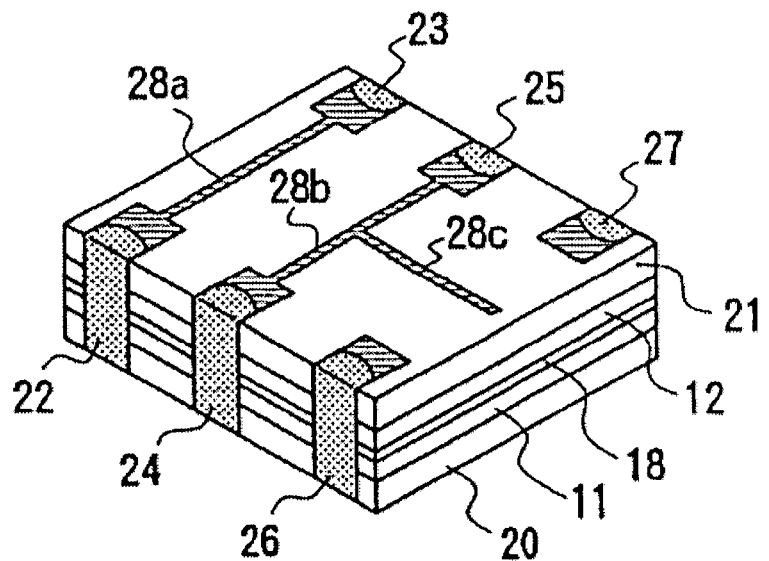
FIG. 7 shows a back surface view of the perspective appearance of the chip-type piezoelectric component shown in FIG. 6.
Figure 9:
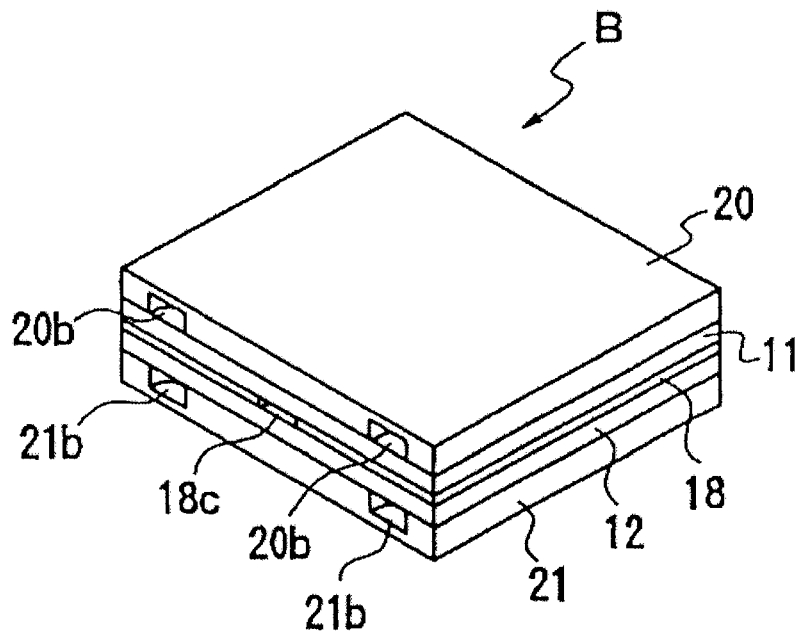
FIG. 9 shows a perspective view of the laminated body before forming the electrode on the chip-type piezoelectric component shown in FIG. 6.

After preparing a laminated body B as shown in FIG. 9 by laminating the first and second resonator elements 11 and 12, the sheet of the intermediate layer 18, and the seal substrates 20 and 21 via the adhesive layers with bonding, a total of the six external electrodes 22 to 27 are provided on the opposing two side edges of the laminated body B to be continuous along the direction of thickness, thereby obtaining a chip-type piezoelectric filter as shown in FIGS. 6 and 7. First end portions of the external electrodes 22 to 27 are extended to the surface of the laminated body B, while second end portions of the external electrodes 22 to 27 are extended to the back surface of the laminated body B.

A metal plating layer having good compatibility with solder is also provided on the substrate electrodes on which the conductive paste is coated and baked, in the external electrodes 22 to 27 described above, as were those in the first preferred embodiment of the present invention. The continuous substrate electrodes is provided on the side surface at the end of the laminated body B and in the recesses by filling the conductive paste in the second recesses 20b and 21b, and on the cut portions 18b and 18c when the substrate electrodes are provided. Consequently, the substrate electrode having a high bonding strength is provided.

The electrode patterns, as shown in FIG. 7, have been previously formed on the lower surface of the lower side seal substrate 21 as the electrodes to be connected to the external electrodes 22 to 27. That is, the external electrodes 22 and 23 in electrical continuity with the terminal electrodes 15b and 15b of the first and second resonator elements 11 and 12 are connected to one another with an electrode 28a extending toward the transverse direction. The external electrodes 24 and 25 at the ground-side are also connected to one another with an electrode 28b. In addition, the electrode 28b has an elongation part 28c extending between the input side (or the output side) electrode 26 and the input side (or the output side) electrode 27, wherein the elongation part 28c is provided in order to reduce stray capacitance between the electrodes 26 and 27.

Figure 10:
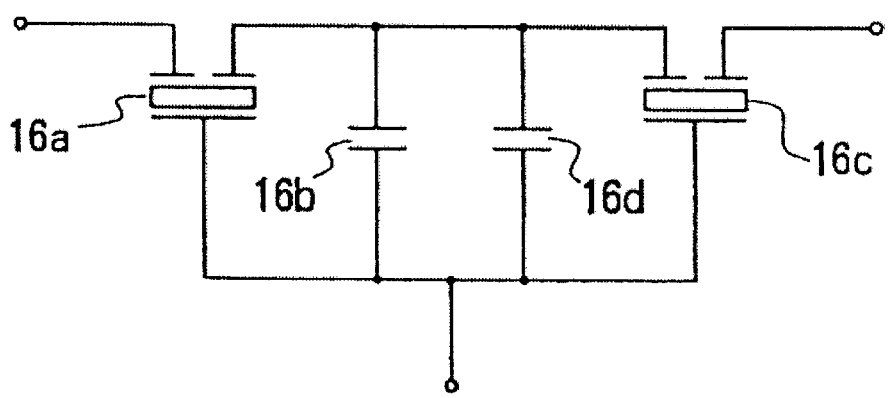
FIG. 10 shows a circuit diagram of the chip-type piezoelectric component shown in FIG. 6.

A circuit diagram of the piezoelectric filter is shown in FIG. 10. As is evident from FIG. 10, the first resonator element 11 includes a first filter part 16a including the vibration electrodes 13a and 13b, and the common electrode 13c, and a relay capacitance part 16b including the capacitance electrodes 15b and 15e. The second resonator element 12 also includes a second filter part 16c having the vibration electrodes 13a and 13b, and the common electrode 13c, and a relay capacitance part 16d including the capacitance electrodes 15b and 15e.

While the first and second filter parts 16a and 16c are connected to one another via the relay capacitance parts 16b and 16d in the chip-type piezoelectric filter in this preferred embodiment, a shield electrode 15f is connected to the common electrodes 13c to be connected to the ground potential. Accordingly, stray capacitance between the terminal electrodes 15a is more effectively reduced.

The present invention is not restricted in any sense to the preferred embodiments as set forth above.

While the external electrode is configured to have a three layer structure including a substrate layer having a conductive layer and two metal plating layers, the structure of the external electrode is not necessarily restricted to the above structure. The metal plating may be applied either in one layer or in three layers or more.

The conductive film to be formed on the surface of the external electrode is not limited to the plating layer. The film may be formed either by sputtering, by vacuum deposition, or other suitable method.

As is evident from the foregoing descriptions, external electrodes including a conductive paste are continuously provided on the end surface at the end of the laminated body prepared by laminating a piezoelectric element and seal substrates with bonding in the chip-type piezoelectric component according to preferred embodiments of the present invention, besides embedding a part of the external electrodes into recesses. Consequently, the bonding strength of the external electrodes with the laminated body is greatly increased by the wedge effect of the conductive paste penetrated in the recess. As a result, the electrodes are prevented from peeling caused by the attack of the complexing agent in the plating bath, when a plating film is formed, for example, on the surface layer of the external electrode.

Since a portion of the external electrode is embedded in the recess in which a part of the terminal electrode of the piezoelectric element is exposed, electrical continuity between the terminal electrode and the external electrode of the piezoelectric element is secured. In addition, the formation the external electrode is simplified because the external electrode is not required to be formed in two steps as in the conventional process.

It should be understood that the foregoing description is only illustrative of the present invention. Various alternatives and modifications can be devised by those skilled in the art without departing from the invention. Accordingly, the present invention is intended to embrace all such alternatives, modifications and variations which fall within the scope of the appended claims.

What is claimed is:

1. A chip-type piezoelectric component comprising:
   a piezoelectric element including two major surfaces;
   vibration electrodes and terminal electrodes connected to the vibration electrodes and provided on the two major surfaces of the piezoelectric element;
   at least two adhesive layers each provided on a respective one of the major surfaces of the piezoelectric element at least excluding the vibration electrode area; and
   a laminated body including at least two seal substrates bonded via the at least two adhesive layers with the piezoelectric element disposed between the at least two seal substrates;
   external electrodes arranged to extend the terminal electrodes out to the side surfaces at an end of the laminated body; wherein
   each of the opposite ends of each of the at least two adhesive layers and the at least two seal substrates have recesses formed therein, wherein the recesses in the at least two adhesive layers and the at least two seal substrates are aligned with each other at opposite ends of the laminated body and expose opposite end portions of the piezoelectric element which does not have any recesses formed therein;
   the external electrodes are continuously provided along the direction of thickness on the side surfaces at the opposite ends of the laminated body, and are defined by a monolithic conductive film embedded in the recesses in the opposite ends of the at least two adhesive layers and the at least two seal substrates such that the exposed opposite end portions of the piezoelectric element are surrounded by the conductive film material on portions of three surfaces at each of the opposite end portions of the piezoelectric element.

2. A chip-type piezoelectric component according to claim 1, wherein a metal plating layer having good soldering wettability is provided on the outermost layer of the external electrode.

3. A chip-type piezoelectric component according to claim 1, wherein the viscosity of the conductive paste before coating is about 50 Pa·s or less.

4. A chip-type piezoelectric component according to claim 1, wherein the conductive paste includes at least approximately about 80% by weight of the metal particles.

5. A chip-type piezoelectric component according to claim 1, wherein the conductive paste is transferred on the side surface at the end of the laminated body by allowing the conductive paste before hardening to rise from discharge holes comprising slit grooves or a belt of a number of perforated holes, followed by pressing the conductive paste onto the side surface at the end of the laminated body so that the side surface cross the discharge holes.

6. A chip-type piezoelectric component according to claim 1, wherein said recesses in said laminated body have a substantially semicircular configuration.

7. A chip-type piezoelectric component according to claim 1, wherein said chip-type piezoelectric component is configured to operate in a thickness extensional vibration mode.

8. A chip-type piezoelectric component according to claim 1, further comprising another piezoelectric element having vibration electrodes on opposed major surfaces thereof, and terminal electrodes connected to said vibration electrodes, said two piezoelectric elements are stacked via an intermediate element.

9. A chip-type piezoelectric component according to claim 8, wherein said intermediate element includes an open space to permit vibration of the piezoelectric element facing the intermediate element.

10. A chip-type piezoelectric component according to claim 8, wherein one of said vibration electrodes of each of said piezoelectric elements is a common electrode.

11. A chip-type piezoelectric component according to claim 10, wherein said common electrodes surface said intermediate element.

12. A chip-type piezoelectric component according to claim 8, wherein said intermediate element includes cut portions corresponding to locations of said recesses of said laminated body.

13. A chip-type piezoelectric component comprising:
    a piezoelectric element having two major surfaces;
    vibration electrodes and terminal electrodes connected to the vibration electrodes and provided on the two major surfaces of the piezoelectric element;
    at least two adhesive layers each provided on a respective one of the major surfaces of the piezoelectric element such that said at least two adhesive layers are not present in the vibration electrode area; and
    a laminated body including at least two seal substrates bonded via the adhesive layer with the piezoelectric element disposed between the at least two seal substrates, external electrodes electrically connected to the terminal electrodes to expose the terminal electrodes to an outer surface of the laminated body; wherein
    each of the opposite ends of each of the at least two adhesive layers and the at least two seal substrates have recesses formed therein, wherein the recesses in the at least two adhesive layers and the at least two seal substrates are aligned with each other at opposite ends of the laminated body and expose opposite end portions of the piezoelectric element which does not have any recesses formed therein;
    the external electrodes are continuously provided along the direction of thickness on the side surfaces at the ends of the laminated body, and are disposed in the recesses in the opposite ends of the at least two adhesive layers and the at least two seal substrates such that the exposed opposite end portions of the piezoelectric element are surrounded by the conductive film material on portions of three surfaces at each of the opposite end portions of the piezoelectric element.

14. A chip-type piezoelectric component according to claim 13, wherein said external electrode is defined by a monolithic conductive film embedded in the recess.

15. A chip-type piezoelectric component according to claim 14, wherein the conductive film is defined by a coated and baked conductive paste including a resin composition and metal particles.

16. A chip-type piezoelectric component according to claim 13, wherein a metal plating layer having good soldering wet ability is provided on the outermost layer of the external electrode.

17. A chip-type piezoelectric component according to claim 15, wherein the viscosity of the conductive paste before coating is about 50 Pa·s or less.

18. A chip-type piezoelectric component according to claim 15, wherein the conductive paste includes at least approximately about 80% by weight of the metal particles.

19. A chip-type piezoelectric component according to claim 15, wherein the conductive paste is transferred on the side surface at the end of the laminated body by allowing the conductive paste before hardening to rise from discharge holes comprising slit grooves or a belt of a number of perforated holes, followed by pressing the conductive paste onto the side surface at the end of the laminated body so that the side surface cross the discharge holes.

20. A chip-type piezoelectric component according to claim 13, wherein said recesses in said laminated body have a substantially semicircular configuration.

* * * * *